United States Patent
Lee

(10) Patent No.: US 7,196,962 B2
(45) Date of Patent: Mar. 27, 2007

(54) PACKET ADDRESSING PROGRAMMABLE DUAL PORT MEMORY DEVICES AND RELATED METHODS

(75) Inventor: Dong-Woo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 233 days.

(21) Appl. No.: 10/937,519

(22) Filed: Sep. 9, 2004

(65) Prior Publication Data

US 2005/0122824 A1 Jun. 9, 2005

(30) Foreign Application Priority Data

Dec. 5, 2003 (KR) .................. 10-2003-0087974

(51) Int. Cl.
*G11C 7/10* (2006.01)
*G11C 11/4093* (2006.01)
*G11C 11/4096* (2006.01)
*G11C 8/12* (2006.01)

(52) U.S. Cl. ............... 365/230.05; 365/219; 365/220; 365/221; 365/239; 365/230.03; 365/238.5; 365/189.04

(58) Field of Classification Search ............... 365/219, 365/220, 221, 239, 189.04, 230.03, 230.05, 365/238.5
See application file for complete search history.

(56) References Cited

U.S. PATENT DOCUMENTS 5,450,355 A * 9/1995 Hush .................... 365/189.04
5,726,948 A * 3/1998 Hush et al. ........... 365/230.05

* cited by examiner

*Primary Examiner*—J. H. Hur
(74) *Attorney, Agent, or Firm*—Myers Bigel Sibley & Sajovec

(57) ABSTRACT

In a packet addressing method, one or more memory blocks are selected from a plurality of memory blocks and one or more data I/O pads are selected from a plurality of data I/O pads via which data input or output to/from the selected memory blocks are loaded, memory cell data output from the selected memory blocks are sequentially output to the selected data I/O pads, and data input to the selected data I/O pads are sequentially input to the selected memory blocks, so that read and write operations are independently accomplished in each of data I/O pads. The data I/O width can be adjusted according to the word length which is selectively set up, and power consumption can be reduced due to partial activation of the memory block.

17 Claims, 9 Drawing Sheets

FIG. 4

| MEMORY CONTROLLER ADDRESS | A31 | A30 | A29 | A28 | A27 | A26 | A25 | A24 | A23 | A22 | A21 |
|---|---|---|---|---|---|---|---|---|---|---|---|
| MEMORY DEVICE ADDRESS | RA8 | RA7 | RA6 | RA5 | RA4 | RA3 | RA13 | BA1 | BA0 | RA10 | RA9 |
| | | | | | | | | WL1 | WL0 | | |

| MEMORY CONTROLLER ADDRESS | A20 | A19 | A18 | A17 | A16 | A15 | A14 | A13 | A12 | A11 | A10 |
|---|---|---|---|---|---|---|---|---|---|---|---|
| MEMORY DEVICE ADDRESS | CA6 | CA5 | CA4 | CA3 | CA2 | CA1 | CA0 | RA1 | RA0 | CA8 | CA7 |

| MEMORY CONTROLLER ADDRESS | A9 | A8 | A7 | A6 | A5 | A4 | A3 | A2 | A1 | A0 | |
|---|---|---|---|---|---|---|---|---|---|---|---|
| MEMORY DEVICE ADDRESS | | | | | | | | RA12 | RA11 | x | |
| | | | | | | | | SEL1 | SEL0 | | |

PACKET ADDRESSING PROGRAMMABLE DUAL PORT MEMORY DEVICES AND RELATED METHODS

CLAIM OF PRIORITY

This application claims the priority under 35 U.S.C. § 119 of Korean Patent Application No. 2003-87974, filed on Dec. 5, 2003, in the Korean Intellectual Property Office, the disclosure of which is incorporated herein in its entirety by reference.

FIELD OF THE INVENTION

The present invention relates to semiconductor memory devices, and more particularly, to dual port semiconductor memory devices.

BACKGROUND OF THE INVENTION

Conventional dynamic random access memory (DRAM) devices have widely been used in the main memory of personal computers. In a DRAM that is used as part of a main memory, read and write operations typically are performed with a burst length that is set based on internal register values in the DRAM and a data width that is fixed by a data mask signal DQM. Typically, the DRAM has a relatively large data width, such as, for example, x16 or x32.

FIG. 1 is a timing chart showing a data output scheme according to a conventional addressing method in a DRAM. A row address RA is input together with an active command ACTIVE in synchronization with a clock signal CLOCK. Then a column address, for example, xxxxxx00, is input together with a read command READ. Memory cell data corresponding to the row address and the column address are output to 1st through 16th data input/output (I/O) pads DQ0 through DQ15 in synchronization with the clock signal CLOCK after a predetermined time period. Data corresponding to a burst length of, for example, 4 (BL=4), i.e., memory cell data corresponding to column addresses xxxxxx00->xxxxxx01->xxxxxx10->xxxxxx11, are sequentially output to the 16 data I/O pads DQ0 through DQ15 in synchronization with the clock signal CLOCK.

When a DRAM having a data width of x16 is used in system applications that need a smaller data width such as x4 and x8 (e.g., notebook computers, mobile phones, or PDAs), the surplus data width may increase power consumption.

SUMMARY OF THE INVENTION

Pursuant to certain embodiments of the present invention, memory devices are provided which have a plurality of memory cells that are grouped into a plurality of memory blocks and a plurality of data input/output pads. The devices further include at least one decoder that is configured to select one or more of the memory blocks and one or more of the data input/output pads in response to one or more input signals. The device also includes a plurality of switches that are configured to selectively transfer data between the selected data input/output pads and at least some of the memory cells in the selected memory blocks. In these devices, the data input/output pads may be configured to sequentially transfer sequentially addressed data to or from at least some of the memory cells in the selected one or more memory blocks. In these memory devices, a write operation may be initiated to write data from some of the plurality of memory cells to a first group of the data input/output pads data before completion of a read operation which reads data from a second group of data input/output pads to other of the plurality of memory cells.

These memory devices may further include an internal bus that couples data between the plurality of data input/output pads and the plurality of memory cells. The at least one input signal may be a word length signal that selects one or more of the memory blocks and a selection signal that selects one or more of the data input/output pads. The word length signal may specify the burst length of the memory cell data transferred between the memory cells of the selected memory blocks and the data input/output pads.

The memory devices may also include a plurality of parallel-to-serial converter units that are configured to transfer memory cell data in the selected memory blocks to the selected data input/output pads via respective of the plurality of switches and/or a plurality of serial-to-parallel converter units that are configured to transfer data received from the selected data input/output pads via respective of the plurality of switches to the memory cells in the selected memory blocks.

Pursuant to further embodiments of the present invention, methods of transferring data between a plurality of memory blocks of a memory device and a plurality of data input/output pads are provided. Pursuant to these methods, at least one of the memory blocks may be selected in response to a first word length signal, and at least one of the data input/output pads may be selected in response to a first selection signal. Parallel data output from a plurality of memory cells within each of the selected memory blocks may then be converted into serial data, and the serial data is sequentially output to the selected data input/output pads.

In these methods, the data from each of the selected memory blocks may be output in sequential address order. Additionally, the methods may further involve selecting at least one of the memory blocks in response to a second word length signal and selecting, in response to a second selection signal, one or more of the data input/output pads that are different than the data input/output pads selected in response to the first selection signal. The serial data received from the one or more data input/output pads selected in response to the second selection signal may then be converted into parallel data, and the parallel data may be written to the memory cells in the memory blocks selected in response to the second word length signal.

BRIEF DESCRIPTION OF THE DRAWINGS

FIG. 4 is an address mapping table between a memory controller and a memory device which may be used with the packet addressing scheme of FIG. 2;

DETAILED DESCRIPTION

Certain embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
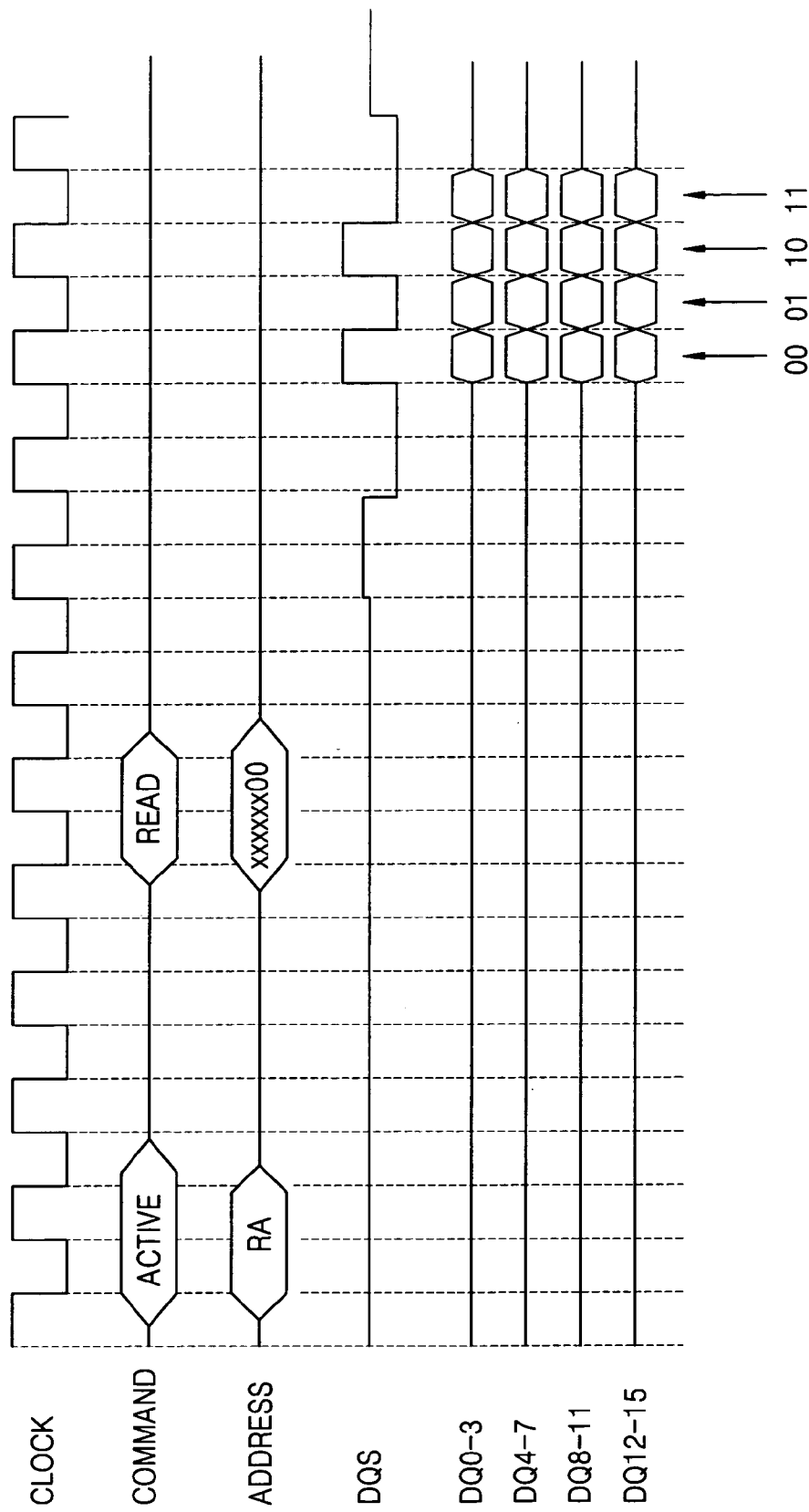
FIG. 1 illustrates a conventional data output scheme for a DRAM memory device.
Figure 2:
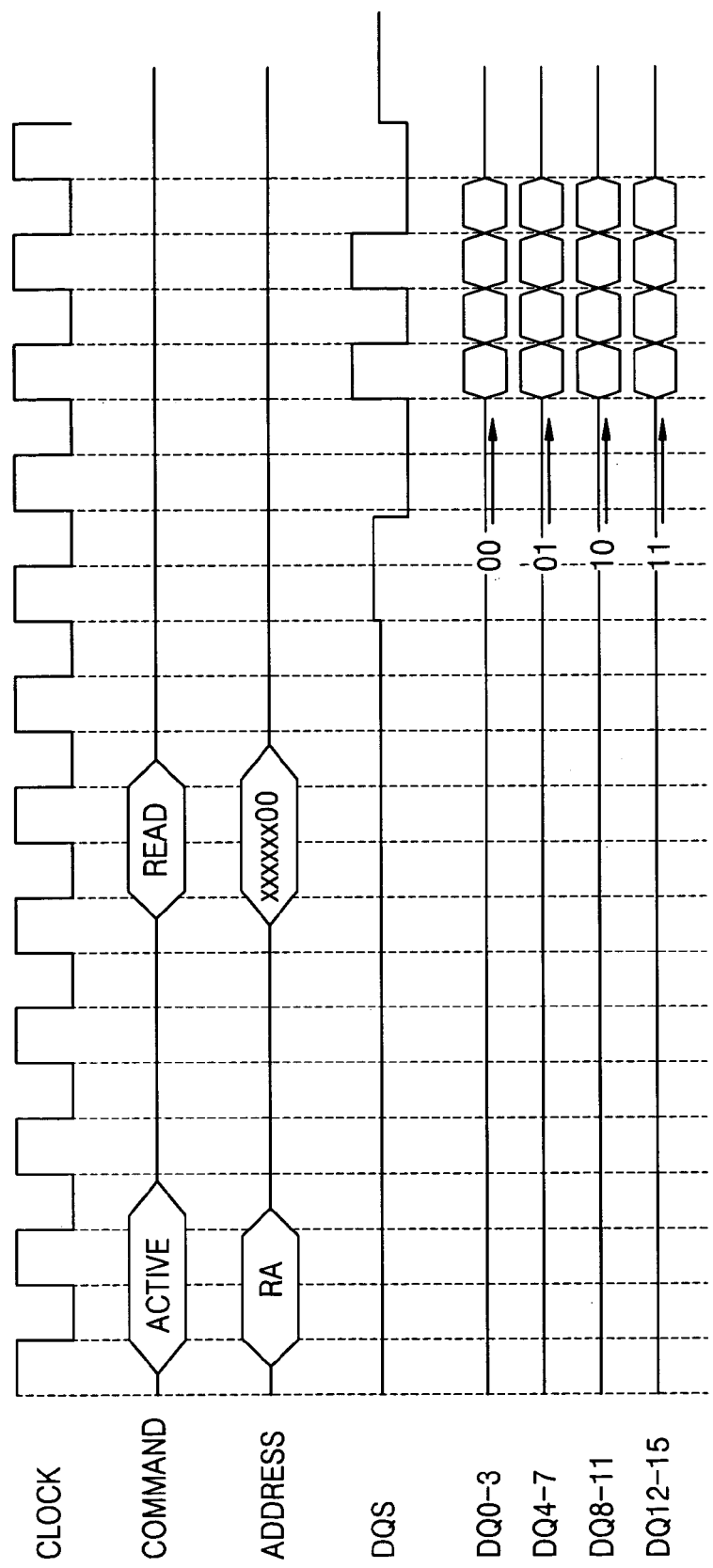
FIG. 2 is a timing diagram illustrating a packet addressing scheme for memory device according to certain embodiments of the present invention.

FIG. 2 is a timing diagram that illustrates a packet addressing method for a memory device according to certain embodiments of the present invention. As shown in FIG. 2, in this packet addressing scheme, memory cell data having a burst length of, for example, 4 (BL=4), corresponding to column address xxxxxx00, are output to a first group of data I/O pads DQ0 through DQ3 in response to four successive clock edges. Memory cell data having a burst length of 4 (BL=4) corresponding to column address xxxxxx01 are output via a second group of data I/O pads DQ4 through DQ7. Memory cell data having a burst length of 4 (BL=4) corresponding to column address xxxxxx10 are output via a third group of data I/O pads DQ8 through DQ11. Finally, memory cell data having a burst length of 4 (BL=4) corresponding to a column address xxxxxx11 are output via a fourth group of data I/O pads DQ12 through DQ15.

Herein, the term "packet addressing" is used to refer to addressing schemes where a plurality of data I/O pads are divided into at least two groups, and data of a predetermined burst length is input or output via one of the groups of data I/O pads. For example, a packet addressing method employed on a memory device having 16 data I/O pads DQ0 through DQ15 might divide the 16 data I/O pads into 4 groups, and allow data of a predetermined burst length, for example, 4, to be output via one group of data I/O pads, for example, the first group of data I/O pads DQ0 through DQ3.

Figure 3:
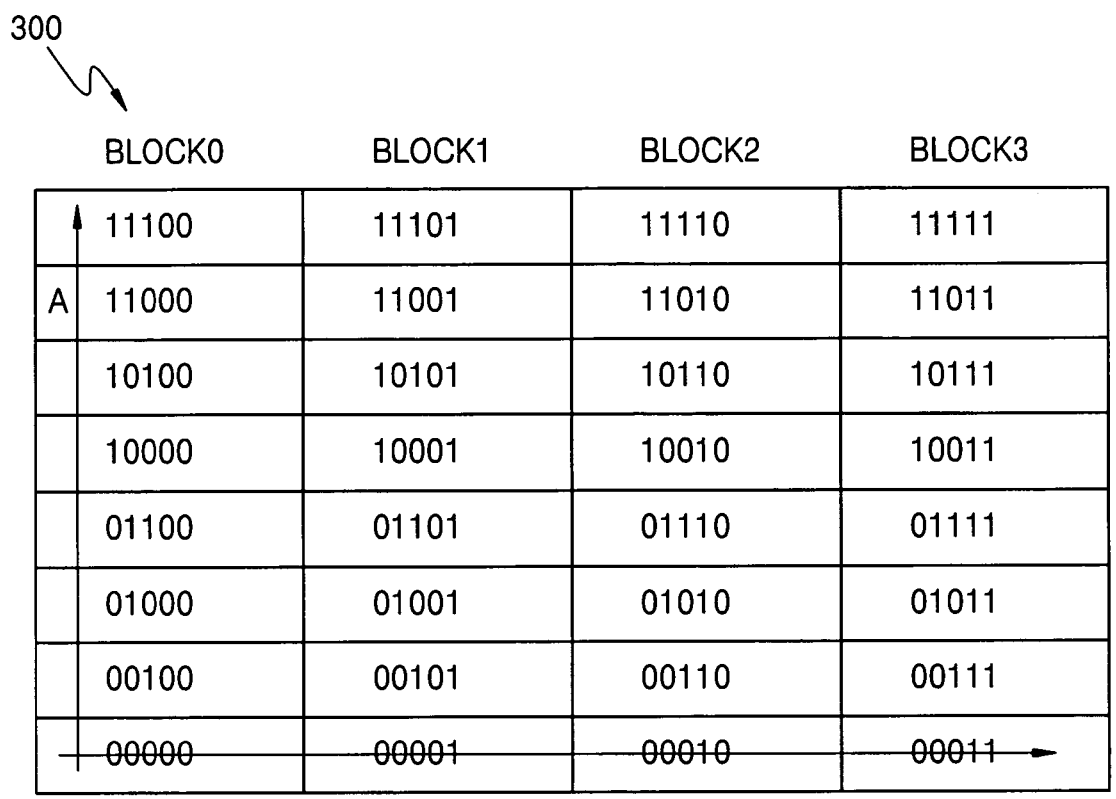
FIG. 3 is a memory block map which may be used to implement the packet addressing scheme shown in FIG. 2.

FIG. 3 shows a memory map which implements a packet addressing scheme according to certain embodiments of the present invention. In the memory array having 4 blocks BLOCK0 through BLOCK3, the first block BLOCK0 has a lowest significant address set to 00, the second block BLOCK1 has a lowest significant address set to 01, the third block BLOCK2 has a lowest significant address set to 10, and the fourth block BLOCK3 has a lowest significant address set to 11.

The memory map in FIG. 3 will be described in conjunction with the packet addressing method illustrated in FIG. 2. In response to a column address xxxxxx00, memory cells are sequentially addressed in direction A, that is, from the address 00000 to the address 11100 in the first block BLOCK0, so that the memory cell data can be output via the first group of data I/O pads DQ0 through DQ3. Similarly, in response to the column address xxxxxx01, memory cells are sequentially addressed in the direction from the address 00001 to the address 11101 in the second block BLOCK1, so that the memory cell data can be output via the second group of data I/O pads DQ4 through DQ7. In response to the column address xxxxxx10, memory cells are sequentially addressed in the direction from the address 00010 to the address 11110 in the third block BLOCK2, so that the memory cell data can be output via the third group of data I/O pads DQ8 through DQ11. In response to the column address xxxxxx11, memory cells are sequentially addressed in the direction from the address 00011 to the address 11111 in the fourth block BLOCK4, so that the memory cell data can be output via the fourth group of data I/O pads DQ12 through DQ15.

In order to implement a packet addressing method according to embodiments of the present invention, the memory blocks in FIG. 3 may be identified by defining a most significant address bit or bits of the row address input from the memory controller. For example, if the memory array has 4 blocks, two most significant bits are defined to designate the corresponding memory block. Meanwhile, a least significant address bit input from the memory controller is defined as a memory block selection bit. These are illustrated in the address mapping table in FIG. 4. Referring to FIG. 4, the memory blocks to be selected are partially activated to reduce power consumption in the memory device.

Figure 5:
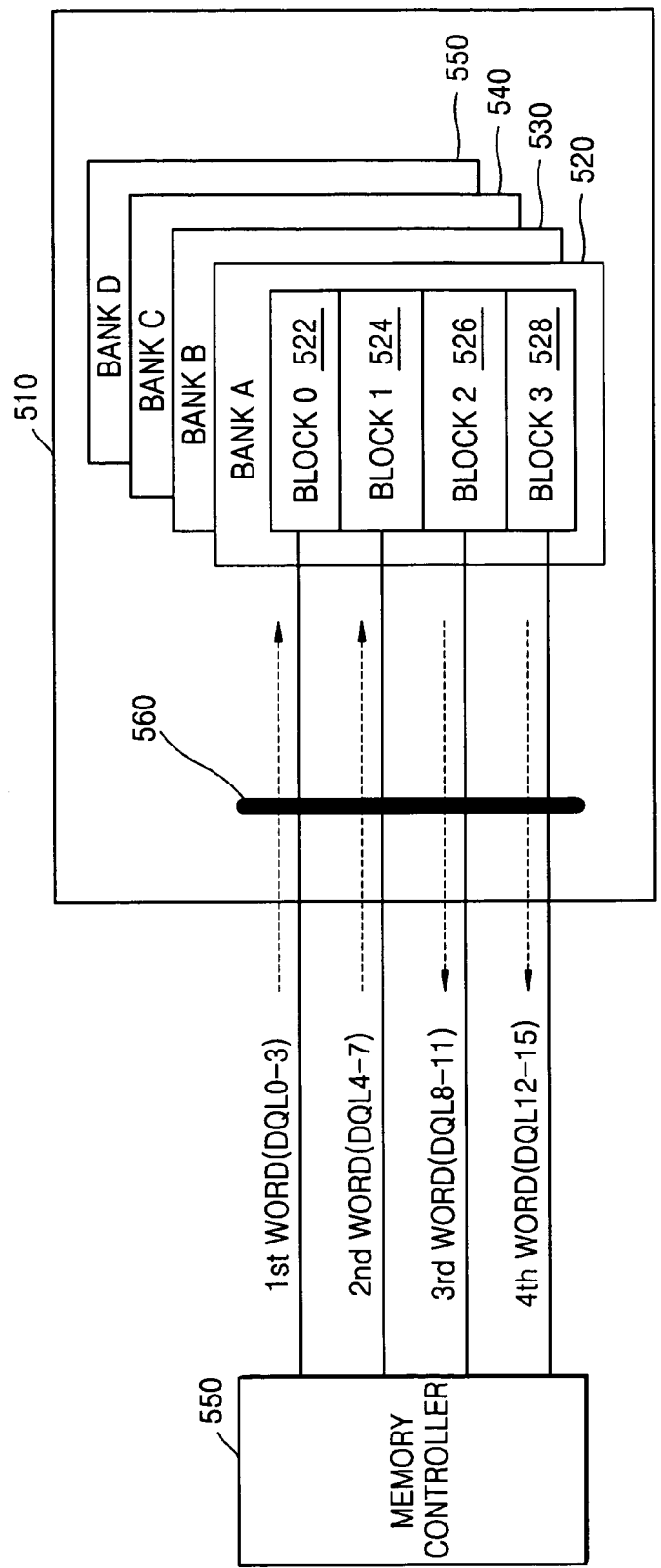
FIG. 5 shows a data I/O arrangement of a programmable dual port memory device according to further embodiments of the present invention.

FIG. 5 shows a data I/O arrangement of a programmable dual port memory device according to further embodiments of the present invention. Data I/O lines DQL0–3, DQL4–7, DQL8–11, and DQL12–15 are connected between the memory device 510 and the memory controller 550. The data I/O lines DQL0–3, DQL4–7, DQL8–11, and DQL12–15 may be directly connected to data I/O ports in the memory device 510. The data to be written to the memory cells are input through the first and second groups of data I/O lines DQL0–3 and DQL4–7, and data read from the memory cells are output through the third and fourth groups of data I/O lines DQL8–11 and DQL12–15.

In other words, first word data 1st WORD input through the first group of data I/O lines DQL0–3 are written to a first BLOCK0 in each of the selected banks 520, 530, 540, and 550 by way of an internal main bus 560. Similarly, second word data 2nd WORD input through the second group of data I/O lines DQL4–7 are written to a second block BLOCK1 in each of the selected banks 520, 530, 540, and 550 by way of the internal main bus 560. Data read from a third block BLOCK2 in each of the selected banks 520, 530, 540, and 550 are loaded on the third group of data I/O lines DQL8–11 by way of the internal main bus 560. Similarly, data read from a fourth block BLOCK3 in each of the selected banks 520, 530, 540, and 550 are loaded on the fourth group of data I/O lines DQL12–15 by way of the internal main bus 560.

Figure 6:
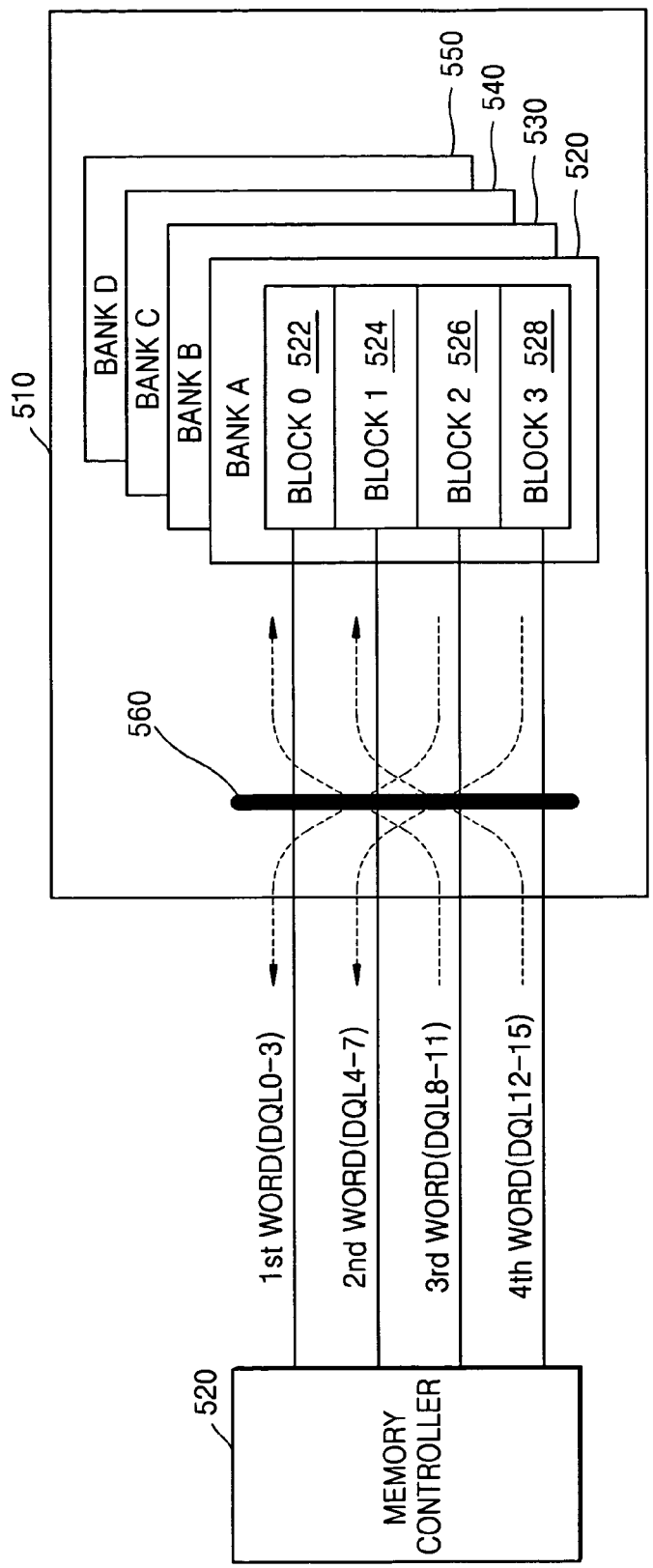
FIG. 6 shows a data I/O arrangement of a programmable dual port memory device according to still further embodiments of the present invention.

FIG. 6 shows another data I/O arrangement of a programmable dual port memory device according to further embodiments of the present invention. The read memory cell data are output through the first and second groups of data I/O lines DQL0–3 and DQL4–7. The data to be written to the memory cells are input through the third and fourth groups of data I/O lines DQL8–11 and DQL12–15. The data read from the third block Block2 in each of the selected banks 520, 530, 540, and 550 are loaded on the first data I/O lines DQL0–3 by way of the internal main bus 560. The data read from the fourth block Block3 in each of the selected banks 520, 530, 540, and 550 are loaded on the second data I/O lines DQL4–7 by way of the internal main bus 560. The data written to the first block Block0 in each of the selected banks 520, 530, 540, and 550 are loaded on the third data I/O lines DQL8–11 by way of the internal main bus 560. The data written to the second block Block1 in each of the selected banks 520, 530, 540, and 550 are loaded on the fourth data I/O lines DQL12–15 by way of the internal main bus 560.

Figure 7:
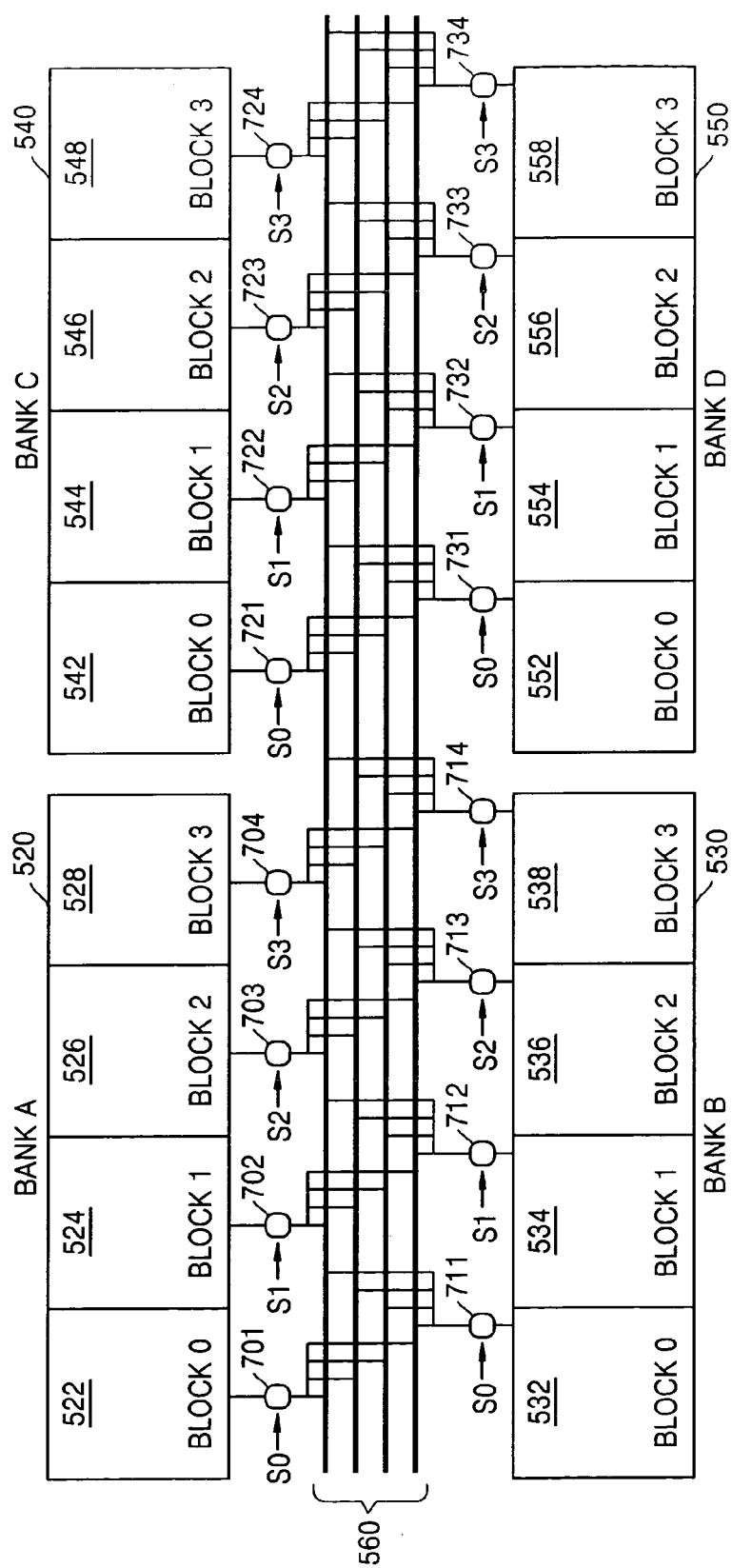
FIG. 7 is a block diagram of an internal main bus structure which may be used to implement the data I/O arrangement shown in FIG. 5 or 6.

FIG. 7 shows an internal bus structure 560 according to embodiments of the present invention which may be used in the programmable dual part memory devices of FIGS. 5 and 6. Switches 701–704, 711–714, 721–724, and 731–734, which respond to the first through fourth switching signals S0, S1, S2, and S3, respectively, are disposed between the internal main bus 560 and each block 522, 524, 526, 528, 532, 534, 536, 538, 542, 544, 546, 548, 552, 554, 556, and 558 in each bank 520, 530, 540, and 550.

Figure 8:
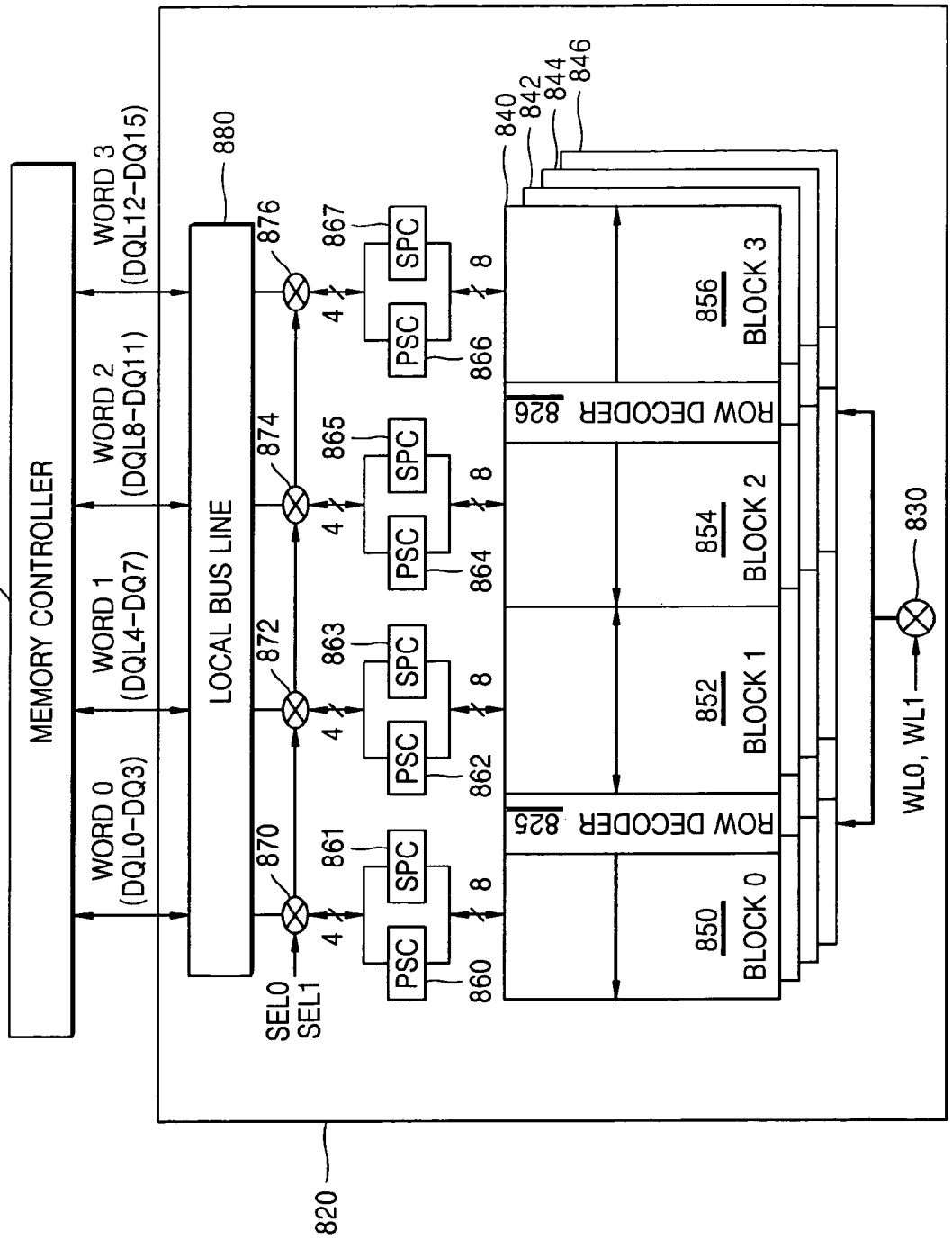
FIG. 8 is a block diagram illustrating a programmable dual port memory device employing the packet addressing method according to certain embodiments of the present invention.

FIG. 8 is a block diagram showing a programmable dual port memory device that implements the packet addressing methods according to embodiments of the present invention. The memory controller 810 and the memory device 820 are connected to each other through the first through fourth data I/O lines DQL0–3, DQL4–7, DQL8–11, and DQL12–15. For convenience of description, the first through fourth words WORD0 to WORD3 refer to the data output through the first through fourth groups of data I/O lines DQL0–3, DQL4–7, DQL8–11, and DQL12–15, respectively.

In the memory device 820, memory cell blocks 850, 852, 854, and 856 in each of the banks 840, 842, 844, and 846 are selected by first and second word length signals WL0 and WL1. Data in the memory cells in each of the selected memory blocks 850, 852, 854, and 856 are output through the first through fourth data I/O lines DQL0–3, DQL4–7, DQL8–11 and DQL12–15 that are selected in response to first and second selection signals SEL0 and SEL1.

In more detail, memory blocks 850, 852, 854, and 856 in each of the selected banks 840, 842, 844, and 846 are selected by a word length decoder 830, which decodes the first and second word length signals WL0 and WL1. In each of the selected memory blocks 850, 852, 854, and 856, predetermined memory cells are selected by row decoders 825 and 826, and the data in the selected memory cells are output through parallel-to-serial converters 860, 862, 864, and 866, by which the memory cell data loaded on 8 data lines are transferred to 4 data lines. The 4 data lines on which the memory cell data are loaded are connected to the first to fourth data I/O lines DQL0–3, DQL4–7, DQL8–11, and DQL12–15 that are selected by data I/O line decoders 870, 872, 874, and 876 in response to the first and second selection signals SEL0 and SEL1 by way of a local bus line 880.

In addition, the data input through the first through fourth data I/O lines DQL0–3, DQL4–7, DQL8–11, and DQL12–15 that are selected by data I/O line decoders 870, 872, 874, and 876 in response to the first and second selection signals SEL0 and SEL1 are input to serial-to-parallel converters 861, 863, 865, and 867. The serial-to-parallel converters 861, 863, 865, 867 take data loaded on, for example, 4 data lines and transfer the data to, for example, 8 data lines. The data loaded on 8 data lines are written to the memory cells in each of the memory blocks 850, 852, 854, and 856 selected by a word length decoder 830.

The word length decoder 830 selects the memory blocks 850, 852, 854, and 856 based on a combination of the first word length signal WL0 and the second word length signal WL1 to determine a word length. For example, the word length can be determined according to the Table 1 below.

TABLE 1

| WL1 | WL0 | Command |
| --- | --- | --- |
| 0 | 0 | Set the word length to 1 during read/write operations |
| 0 | 1 | Set the word length to 2 during read/write operations |
| 1 | 0 | Not applicable |
| 1 | 1 | Set the word length to 4 during read/write operations |

The data I/O line decoders 870, 872, 874, and 876 select the first through fourth data I/O lines DQL0–3, DQL4–7, DQL8–11, and DQL12–15 based on a combination of the first and second selection signals SEL0 and SEL1. For example, the data I/O lines can be determined according to Table 2 below.

TABLE 2

| SEL1 | SEL0 | Meaning of Command |
| --- | --- | --- |
| 0 | 0 | Read/write operations are performed by DQL0–3 |
| 0 | 1 | Read/write operations are performed by DQL4–7 |
| 1 | 0 | Read/write operations are performed by DQL8–11 |
| 1 | 1 | Read/write operations are performed by DQL12–15 |

Figure 9:
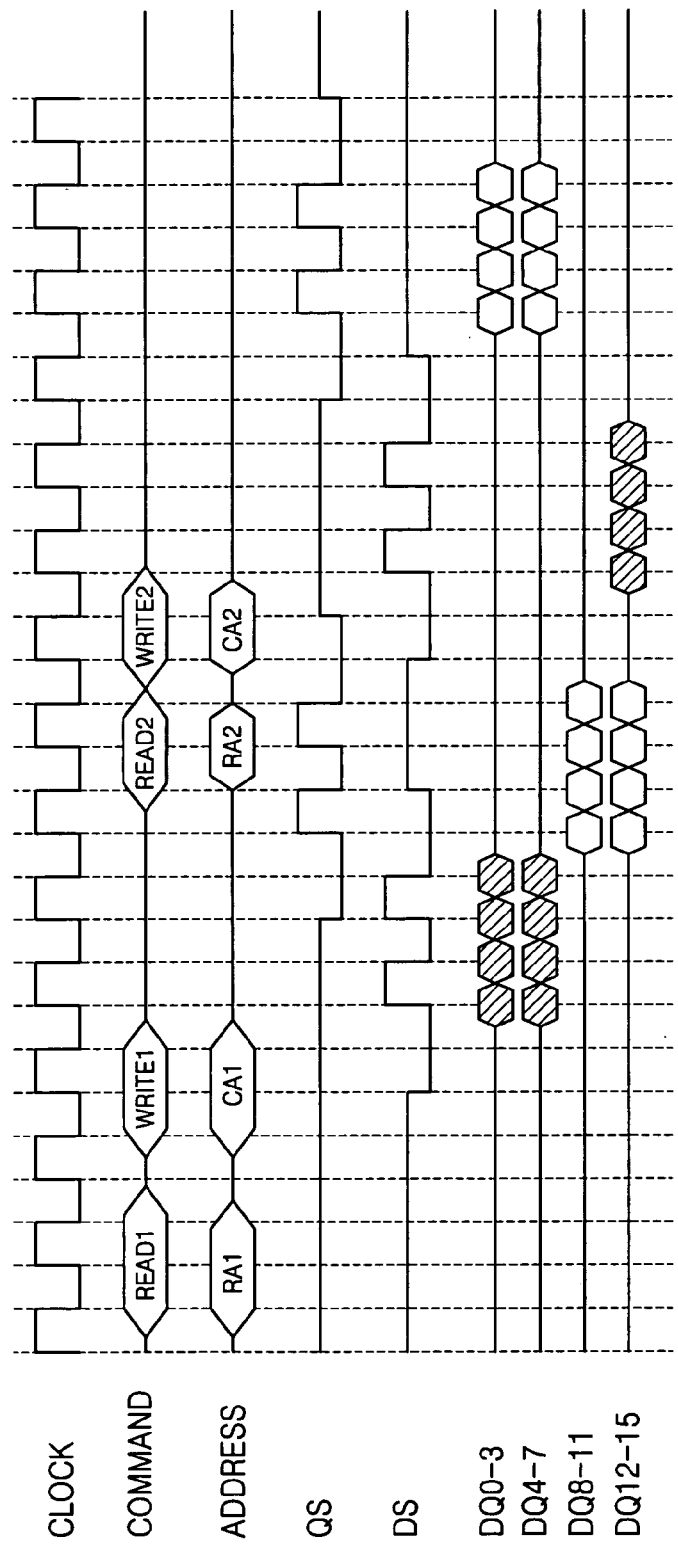
FIG. 9 is a timing diagram illustrating operation of the memory device of FIG. 8.

FIG. 9 is a timing diagram showing operations of the memory device in FIG. 8. The address signals RA1, CA1, RA2, and CA2 are input together with read commands READ1 and READ2 and write commands WRITE1 and WRITE2 in synchronization with a clock signal CLOCK. In response to the first write command WRITE1 corresponding to the first row and column addresses RA1 and CA1, the first and second words WORD0 and WORD1 are input to the first and second groups of data I/O pads DQ0–3 and DQ4–7, respectively, after a predetermined write latency. In response to the first read command READ1 corresponding to the first row and column addresses RA1 and CA1, the third and fourth words WORD2 and WORD3 are output to the third and fourth groups of data I/O pads DQ8–1 and DQ12–15, respectively, after a predetermined read latency. Thus, the write and read operations corresponding to the first row and column addresses RA1 and CA1 are independently performed through different pads.

In addition, in response to the second write command WRITE2 corresponding to the second row and column addresses RA2 and CA2, the fourth word WORD3 is input to the fourth group of data I/O pads DQ12–15, after a predetermined write latency. In response to the second read command READ2 corresponding to the second row and column addresses RA2 and CA2, the first and second words WORD0 and WORD1 are output to the first and second groups of data I/O pads DQ0–3 and DQ4–7, respectively, after a predetermined read latency. Thus, the read and write operations corresponding to the second row and column addresses RA2 and CA2 are performed through different word pads with different word lengths.

As a consequence, with the packet addressing type programmable dual port memory devices according to embodiments of the present invention, the read and write operations may be independently performed through the data I/O pads. Additionally, the data I/O widths of the memory device can be adjusted according to the word lengths which are selectively established.

In embodiments of the present invention, it has been described that the first to fourth groups of data I/O pads DQ0–3, DQ4–7, DQ8–11, and DQ12–15 are connected to the memory controller through the first to fourth groups of data I/O lines DQL0–3, DQL4–7, DQL8–11, DQL12–15.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A memory device comprising:
   a plurality of memory cells that are grouped into a plurality of memory blocks;
   a plurality of data input/output pads;
   at least one decoder that is configured to select one or more of the memory blocks and one or more of the data input/output pads in response to at least one input signal; and
   a plurality of switches that are configured to selectively transfer data between the selected data input/output pads and at least some of the memory cells in the selected memory blocks based on the decoder selections;
   wherein the data input/output pads sequentially transfer sequentially addressed data to or from at least some of the memory cells in the selected one or more memory blocks, and
   wherein the at least one input signal comprises a word length signal that selects one or more of the memory blocks and a selection signal that selects one or more of the data input/output pads.

2. The memory device of claim 1, wherein a write operation is initiated to write data to some of the plurality of memory cells from a first group of the selected data input/output pads before completion of a read operation which reads data from other of the plurality of memory cells to a second group of the selected data input/output pads.

3. The memory device of claim 1, further comprising an internal bus that couples data between the plurality of data input/output pads and the plurality of memory cells.

4. The memory device of claim 1, wherein the word length signal specifies the burst length of the memory cell data transferred between the memory cells of the selected memory blocks and the selected data input/output pads.

5. The memory device of claim 1, further comprising a plurality of parallel-to-serial converter units that are configured to transfer memory cell data in the selected memory blocks to the selected data input/output pads via respective of the plurality of switches.

6. The memory device of claim 1, further comprising a plurality of serial-to-parallel converter units that are configured to transfer data received from the selected data input/output pads via respective of the plurality of switches to the memory cells in the selected memory blocks.

7. A packet addressing type memory device comprising:
   a plurality of memory blocks comprising a plurality of memory cells;
   a word length decoder that is configured to decode a word length signal that selects a predetermined one of the memory blocks;
   a plurality of data input/output pads that sequentially transfer sequentially addressed data to or from memory cells in the selected memory block;
   a data input/output pad decoder that is configured to decode a selection signal that selects a group of the data input/output pads; and
   a plurality of switches and an internal bus that are configured to selectively transfer data between the selected data input/output pads and the selected memory block.

8. The memory device of claim 7, wherein a write operation is initiated to write data to some of the plurality of memory cells from a first group of the selected data input/output pads before completion of a read operation which reads data from other of the plurality of memory cells to a second group of data input/output pads.

9. The memory device of claim 7, wherein the word length signal comprises at least one most significant bit of an address signal provided to the memory device.

10. The memory device of claim 7, wherein memory cell data corresponding to a burst length are output to the data input/output pads determined by the word length signal.

11. The memory device of claim 5, further comprising a plurality of parallel-to-serial converter units that are configured to transfer memory cell data in the selected memory blocks to the selected data input/output pads.

12. The memory device according to claim 5, further comprising a plurality of serial-to-parallel converter units that are configured to transfer data received from the selected data input/output pads.

13. A method of transferring data between a plurality of memory blocks of a memory device and a plurality of data input/output pads, the method comprising:
   selecting at least one of the memory blocks in response to a first word length signal;
   selecting at least one of the data input/output pads in response to a first selection signal;
   converting parallel data output from a plurality of memory cells within each of the selected memory blocks into serial data; and
   sequentially outputting the serial data to the selected data input/output pads.

14. The method of claim 13, wherein the data from each of the selected memory blocks is output in sequential address order.

15. The method of claim 13, further comprising:
   selecting at least one of the memory blocks in response to a second word length signal;
   selecting, in response to a second selection signal, one or more of the data input/output pads that are different than the data input/output pads selected in response to the first selection signal;
   converting serial data received from the one or more data input/output pads selected in response to the second selection signal into parallel data; and writing the parallel data to the memory cells in the memory blocks selected in response to the second word length signal.

16. The method of claim 15, wherein a write command that is associated with the step of writing the parallel data to the memory cells in the memory blocks selected in response to the second word length signal is received prior to the step of sequentially outputting the serial data to the selected data input/output pads.

17. The method of claim 13, wherein the word length signal corresponds to at least one most significant hit of an address signal received by the memory device.

* * * * *

UNITED STATES PATENT AND TRADEMARK OFFICE
CERTIFICATE OF CORRECTION

PATENT NO. : 7,196,962 B2
APPLICATION NO. : 10/937519
DATED : March 27, 2007
INVENTOR(S) : Lee Page 1 of 1

It is certified that error appears in the above-identified patent and that said Letters Patent is hereby corrected as shown below:

COLUMN 8:
Claim 8, Line 27: Please correct "of data" To read --of the selected data--

Claim 10, Line 32: Please correct "the data" To read --the selected data--

Claim 11, Line 34: Please correct "claim 5" To read --claim 8--
        Line 37: Please correct "blocks" To read --block--

Claim 12, Line 38: Please correct "claim 5" To read --claim 8--

Column 10:
Claim 17, Line 4: Please correct "hit" To read --bit--

Signed and Sealed this

Tenth Day of July, 2007

JON W. DUDAS
*Director of the United States Patent and Trademark Office*